(12) United States Patent
Hamma et al.

(10) Patent No.: US 10,342,117 B2
(45) Date of Patent: Jul. 2, 2019

(54) ASSEMBLY

(71) Applicant: Marquardt GmbH, Reitheim-Weilheim (DE)

(72) Inventors: Andreas Hamma, Tuttlingen (DE); Christian Thum, Liptingen (DE); Guenter Ebner, Bad Dürrheim (DE)

(73) Assignee: Marquardt GmbH, Rietheim-Weilheim (DE)

( * ) Notice: Subject to any disclaimer, the term of this patent is extended or adjusted under 35 U.S.C. 154(b) by 0 days.

(21) Appl. No.: 15/724,336

(22) Filed: Oct. 4, 2017

(65) Prior Publication Data

US 2018/0092202 A1 Mar. 29, 2018

Related U.S. Application Data

(63) Continuation of application No. PCT/EP2016/057576, filed on Apr. 7, 2016.

(30) Foreign Application Priority Data

Apr. 10, 2015 (DE) .................. 10 2015 004 376

(51) Int. Cl.
*H05K 1/02* (2006.01)
*H05K 3/30* (2006.01)
(Continued)

(52) U.S. Cl.
CPC .......... *H05K 1/0263* (2013.01); *H01R 12/58* (2013.01); *H05K 1/0203* (2013.01);
(Continued)

(58) Field of Classification Search
CPC ............ H05K 1/02; H05K 1/263; H05K 3/20; H05K 3/36; H05K 3/202; H05K 7/02;
(Continued)

(56) References Cited

U.S. PATENT DOCUMENTS 3,588,618 A * 6/1971 Otte ...................... H05K 3/301
174/88 R
4,949,225 A * 8/1990 Sagisaka ................ H05K 3/202
361/720

(Continued)

FOREIGN PATENT DOCUMENTS

DE       198 29 920 A1   5/1999
DE  10 2005 006 460 A1   7/2006
(Continued)

OTHER PUBLICATIONS

English translation of International Preliminary Report on Patentability (Chapter I) (Application No. PCT/EP2016/057576) dated Oct. 19, 2017, 9 pages.

(Continued)

*Primary Examiner* — Xiaoliang Chen
(74) *Attorney, Agent, or Firm* — Burr & Brown, PLLC

(57) ABSTRACT

The invention relates to an electrical assembly having a printed circuit board and having a component. The component can be, in particular, an electromechanical component, such as an electrical switching contact, an electrical switch, a relay or the like. The component is electrically and/or mechanically connected to the printed circuit board. A fork-shaped element is arranged between the component and the printed circuit board for the purpose of electrically and/or mechanically connecting the component to the printed circuit board.

11 Claims, 4 Drawing Sheets

(51) Int. Cl.
  *H01R 12/58* (2011.01)
  *H05K 1/18* (2006.01)
  *H01R 4/34* (2006.01)

(52) U.S. Cl.
  CPC .......... *H05K 1/0271* (2013.01); *H05K 1/184* (2013.01); *H05K 3/301* (2013.01); *H01R 4/34* (2013.01); *H05K 1/0265* (2013.01); *H05K 2201/10053* (2013.01); *H05K 2201/10083* (2013.01); *H05K 2201/10189* (2013.01); *H05K 2201/10295* (2013.01); *H05K 2201/10962* (2013.01)

(58) Field of Classification Search
  CPC .......... H05K 7/20; H01H 50/00; H01H 50/14; H01R 12/58; H01R 12/70
  USPC ........ 174/260, 251, 254, 535; 361/344, 723, 361/752, 753, 777; 29/825, 830, 890.03
  See application file for complete search history.

(56) References Cited

U.S. PATENT DOCUMENTS

| | | | | |
|---|---|---|---|---|
| 5,065,283 A * | 11/1991 | Adachi | ............... | H05K 1/0263 361/775 |
| 5,821,672 A * | 10/1998 | Oyama | ............... | H03H 9/1028 310/344 |
| 5,839,189 A | 11/1998 | Pomeroy et al. | | |
| 5,847,512 A * | 12/1998 | Baba | ............... | F21V 19/001 315/51 |
| 5,892,747 A * | 4/1999 | Okada | ............... | G11B 33/121 360/99.18 |
| 6,093,036 A * | 7/2000 | Tohgo | ............... | H01R 13/33 174/261 |
| 6,163,460 A * | 12/2000 | Baur | ............... | H01G 2/04 361/752 |
| 6,194,656 B1 * | 2/2001 | Kondo | ............... | H01H 50/14 174/251 |
| 6,345,902 B2 * | 2/2002 | Ohkohdo | ............... | B60Q 1/2696 362/549 |
| 7,497,733 B1 * | 3/2009 | Van der Steen | ... | H01R 23/6873 439/607.01 |
| 7,748,110 B2 * | 7/2010 | Asahi | ............... | H01R 13/2414 174/254 |
| 2003/0137813 A1 * | 7/2003 | Onizuka | ............... | H05K 1/0263 361/777 |
| 2010/0091464 A1 * | 4/2010 | Ohnishi | ............... | H01L 23/053 361/723 |
| 2012/0214321 A1 * | 8/2012 | Kagimura | ............... | H01R 4/34 439/55 |
| 2015/0146392 A1 * | 5/2015 | Yamashita | ............... | H04N 5/2251 361/753 |
| 2016/0128215 A1 * | 5/2016 | Kanzaki | ............... | H05K 5/0069 361/752 |

FOREIGN PATENT DOCUMENTS

| | | |
|---|---|---|
| DE | 699 36 704 T2 | 12/2007 |
| JP | 06-302932 A1 | 10/1994 |

OTHER PUBLICATIONS

International Search Report and Written Opinion (Application No. PCT/EP2016/057576) dated Jun. 21, 2016.

* cited by examiner ical stresses that are directed differently for each manufactured
ASSEMBLY

CROSS REFERENCE TO RELATED APPLICATIONS

This application is a continuation of International Application No. PCT/EP2016/057576 filed Apr. 7, 2016, which designated the United States, and claims the benefit under 35 USC § 119(a)-(d) of German Application No. 10 2015 004 376.5 filed Apr. 10, 2015, the entireties of which are incorporated herein by reference.

FIELD OF THE INVENTION

The invention relates to an assembly.

BACKGROUND OF THE INVENTION

An assembly of this kind can be used in a battery or a rechargeable battery, in particular, in a battery of the kind in which large currents are intended to be switched. For example, in the assembly, a printed circuit board can advantageously be contact-connected to the poles of the battery, wherein the printed circuit board serves as a carrier for a switching element. The assembly is particularly suitable for use in a motor vehicle.

An assembly of this kind comprises a first subassembly and a second subassembly, wherein the first subassembly is electrically and/or mechanically connected to the second subassembly. Mechanical stresses that, in turn, can lead to damage to the assembly can arise at the electrical and/or mechanical connections.

SUMMARY OF THE INVENTION

The present invention is based on the object of configuring the electrical and/or mechanical connection in such a way that the mechanical stresses at the connection are reduced.

In the assembly according to the present invention, an adapter part is arranged between the first subassembly and the second subassembly for the purpose of electrically and/or mechanically connecting the first subassembly to the second subassembly. In particular, this enables forces acting between the two subassemblies to be absorbed by the adapter part. Forces of this kind can be generated on account of tolerances and/or tolerance positions of the two subassemblies, by stresses on account of heating in at least one of the two subassemblies or the like. Since these forces are absorbed in the adapter part, the otherwise present risk of damage to the electrical and/or mechanical connection between the two subassemblies is at least reduced.

In a further configuration, the first subassembly can be a printed circuit board. The second subassembly can be a component. In particular, the component can be an electromechanical component, such as an electrical switching contact, an electrical switch, a relay or the like. The assembly can, therefore, be an electrical assembly, wherein the component is electrically and/or mechanically connected to the printed circuit board. An electrical assembly of this kind is advantageously suitable for use in a motor vehicle battery.

In a particularly functionally reliable configuration, the adapter part can be a fork-shaped element. In particular, the fork-shaped element can thus be arranged between the component and the printed circuit board for the purpose of electrically and/or mechanically connecting the component to the printed circuit board.

In a further configuration, the adapter part can be screwed, riveted, welded, soldered or the like to the second subassembly, that is to say, in particular, the fork-shaped element can be screwed, riveted, welded, soldered or the like to the component. This creates a simple connection in terms of manufacturing. The adapter part can, for its part, be solderable in a simple manner to the first subassembly, that is to say, in particular, the fork-shaped element can be solderable to the printed circuit board. In a likewise simple manner, electrical contact points can be provided on the printed circuit board for the soldering to the fork-shaped element.

The printed circuit board can be a high-current printed circuit board. For example, a high-current printed circuit board of this kind can be provided with solid copper elements embedded in the printed circuit board for the purpose of conducting a high current. Precisely those large heat stresses that otherwise arise in high-current printed circuit boards of this kind on account of the high currents are significantly reduced in the assembly according to the present invention, with the result that destruction of the assembly is effectively prevented. The functional reliability of an assembly of this kind comprising a high-current printed circuit board is significantly improved with the aid of the present invention.

In an expedient configuration, the fork-shaped element can have a base area and fork prongs extending from the base area. The fork prongs can protrude from the base area in an approximately perpendicular manner. The base area can be configured in an approximately rectangular shape, wherein the fork prongs can be arranged in a simple manner at the sides of the rectangular base area. The fork prongs can be secured in a simple manner to the electrical contact points.

The base area of the fork-shaped element can be secured in a compact manner to the second subassembly, that is to say, in particular, to the component. In a further configuration, if it appears to be expedient for the installation space available for the assembly, a connection part can protrude from the base area. Specifically, the connection part can protrude from the base area, in particular, opposite the fork prongs with respect to the base area. The connection part can then be secured to the second subassembly, that is to say, in particular, to the component.

It may be appropriate, in a cost-effective and simple manner, for the fork-shaped element to be produced from sheet metal as a stamped and bent part.

The following should be noted in respect of a particularly preferred configuration of the electrical assembly according to the present invention.

In electromechanical control devices, the situation often arises whereby electromechanical switching elements are intended to be electrically connected to a central combi-board. These connections cause mechanical forces in the X, Y and/or Z direction, which in turn cause mechanical stresses that are directed differently for each manufactured part. These mechanical stresses in turn lead to these forces acting statically on all affected components. This permanent stress can then lead to destruction of the entire assembly.

The concept according to the present invention consists in relaxing the tolerance positions by up to 100%, with the result that at most a low residual force acts on the affected components. This solution can ensure that all forces that arise are substantially balanced.

Electromechanical assemblies, comprising a relay and a printed circuit board, for example, are intended to be connected to one another. On account of the manufacturing parameters, each assembly has its own tolerances that are always present. In order that no mechanical stresses arise when securing the printed circuit board to the relay, the concept consists in providing an adapter part. The adapter part is a stamped and bent part, for example, which connects the printed circuit board contacts to the individual mechanical contact parts. The individual assemblies consisting of printed circuit board, adapter part and electromechanical assemblies are joined together. The adapter part is connected to the electromechanical contact in a force-fitting manner, for example, by means of a screw, a weld and/or a rivet connection. Furthermore, the adapter part is connected to the printed circuit board by way of a fixed connection, for example by means of soldering. The order of the connection techniques can, of course, be different.

The mechanical connection between the electromechanical assembly and the adapter part is oriented toward the present tolerance positions of the electromechanical component. This freedom with regard to tolerance is retained both in the adapter part and in the printed circuit board. The tolerances present are finally balanced by way of the fixed connection, for example by means of a soldering process or welding process. The result achieved here is that no mechanical stresses act on the assemblies.

For example, a printed circuit board, in particular a high-current printed circuit board, is therefore advantageously provided, in which the connection to further assemblies is mechanically decoupled. Consequently, no, or at most low, mechanical stresses act on the individual assemblies, for example on the printed circuit board, on a relay and/or on other electrical or electronic components on the printed circuit board.

The advantages achieved with the present invention consist, in particular, of the following:

No expensive printed circuit boards having specific contact shapes are required.

All contact points to electromechanical assemblies can be connected using the same design.

A good electrical connection is provided.

A good thermal connection is provided.

A secure connection technique is provided.

A stable connection technique is provided.

It is a mechanically stress-free connection technique.

Good monitoring possibilities are provided in the manufacture of the assembly.

Particularly in the case of high currents, the use of high-current printed circuit boards in an assembly according to the present invention, instead of providing a wiring harness as previously, is not as susceptible to faults as previously. An arrangement of this kind configured in accordance with the present invention is likewise more inexpensive than previous wiring harnesses as well, when all manufacturing-dependent parameters are taken into account. Moreover, an arrangement of this kind configured in accordance with the present invention is also more functionally reliable in operation.

BRIEF DESCRIPTION OF THE DRAWINGS

Exemplary embodiments of the present invention with different refinements and configurations are described in more detail below and illustrated in the drawings.

DETAILED DESCRIPTION OF THE INVENTION

Figure 1:
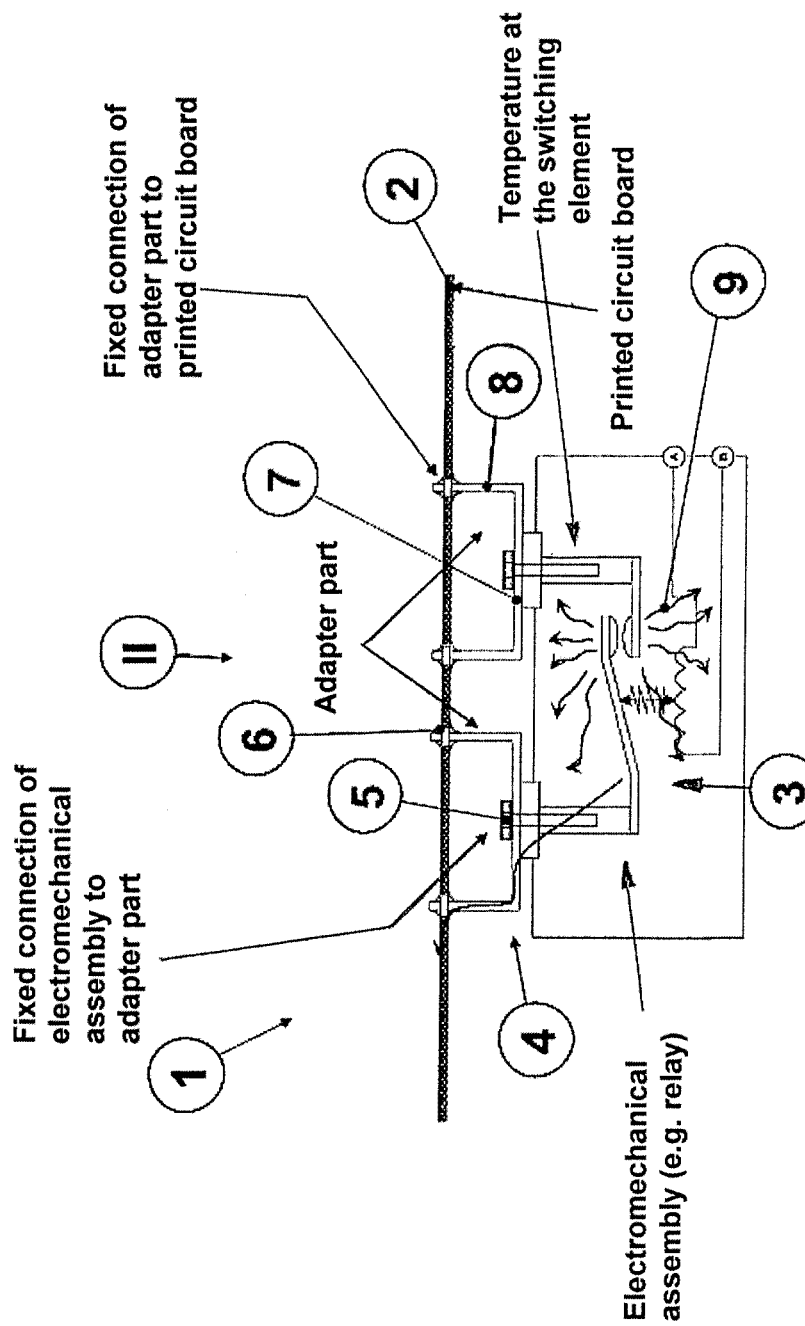
FIG. 1 shows a schematic side view of an electrical assembly.

FIG. 1 shows an assembly 1, which comprises a first subassembly 2 and a second subassembly 3. In the present case, the first subassembly 2 is a printed circuit board and the second subassembly 3 is a component. The component 3 in turn is an electromechanical component, specifically an electrical switching contact. The electrical switching contact 3 can be, for example, a constituent part of an electrical switch, a relay or the like. The assembly 1 is thus an electrical assembly.

The two subassemblies 2, 3 of the assembly 1 are electrically and/or mechanically connected to one another by virtue of the fact that the component 3 is electrically and/or mechanically connected to the printed circuit board 2. An adapter part 4 is arranged between the component 3 and the printed circuit board 2 for the purpose of electrically and/or mechanically connecting the component 3 to the printed circuit board 2. Specifically, an adapter part 4 is provided for each electrical terminal of the component 3. The forces acting between the two subassemblies 2, 3 are absorbed with the aid of the adapter part 4.

In the present case, the adapter part 4 is configured as a fork-shaped element. The fork-shaped element 4 can be screwed to the component 3, and specifically a screw 5 serves for the purpose of screwing the fork-shaped element 4 to the electrical terminal of the switching contact 3. Instead of a screw connection, the fork-shaped element 4 can also be configured to be able to be riveted, welded, soldered or the like to the component 3. The fork-shaped element 4 can, for its part, be soldered to the printed circuit board 2 by means of electrical contact points 6 on the printed circuit board 2.

The fork-shaped element 4 has a base area 7, which is configured in an approximately rectangular shape. The component 3 is secured to the base area 7 by means of the screw 5, specifically by virtue of the fact that, in particular, the base area 7 is secured to the electrical terminal of the switching contact 3 by means of the screw 5. Furthermore, the fork-shaped element 4 has fork prongs 8 extending from the base area 7, protruding in an approximately perpendicular manner. As can be seen with reference to FIG. 2, four fork-shaped prongs 8 are arranged in an approximately rectangular shape at the sides of the base area 7. The tip of the fork prong 8, said tip facing away from the base area 7, is secured to the electrical contact point 6 of the printed circuit board 2 by means of soldering. The fork-shaped element 4 therefore produces the electrical and/or mechanical connection of the component 3 to the printed circuit board 2 by means of the base area 7 and the fork prongs 8. The fork-shaped element 4 is produced from sheet metal as a stamped and bent part.

Figure 2:
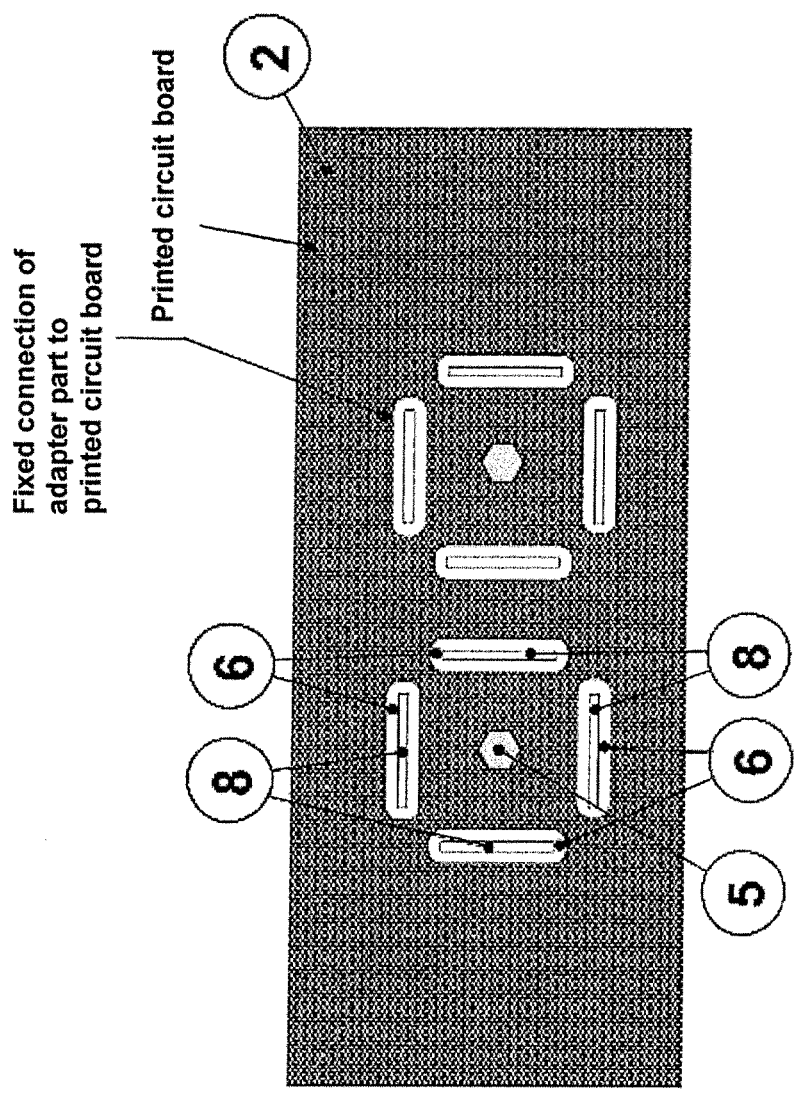
FIG. 2 shows the plan view of the assembly in the direction II in accordance with FIG. 1.
Figure 3:
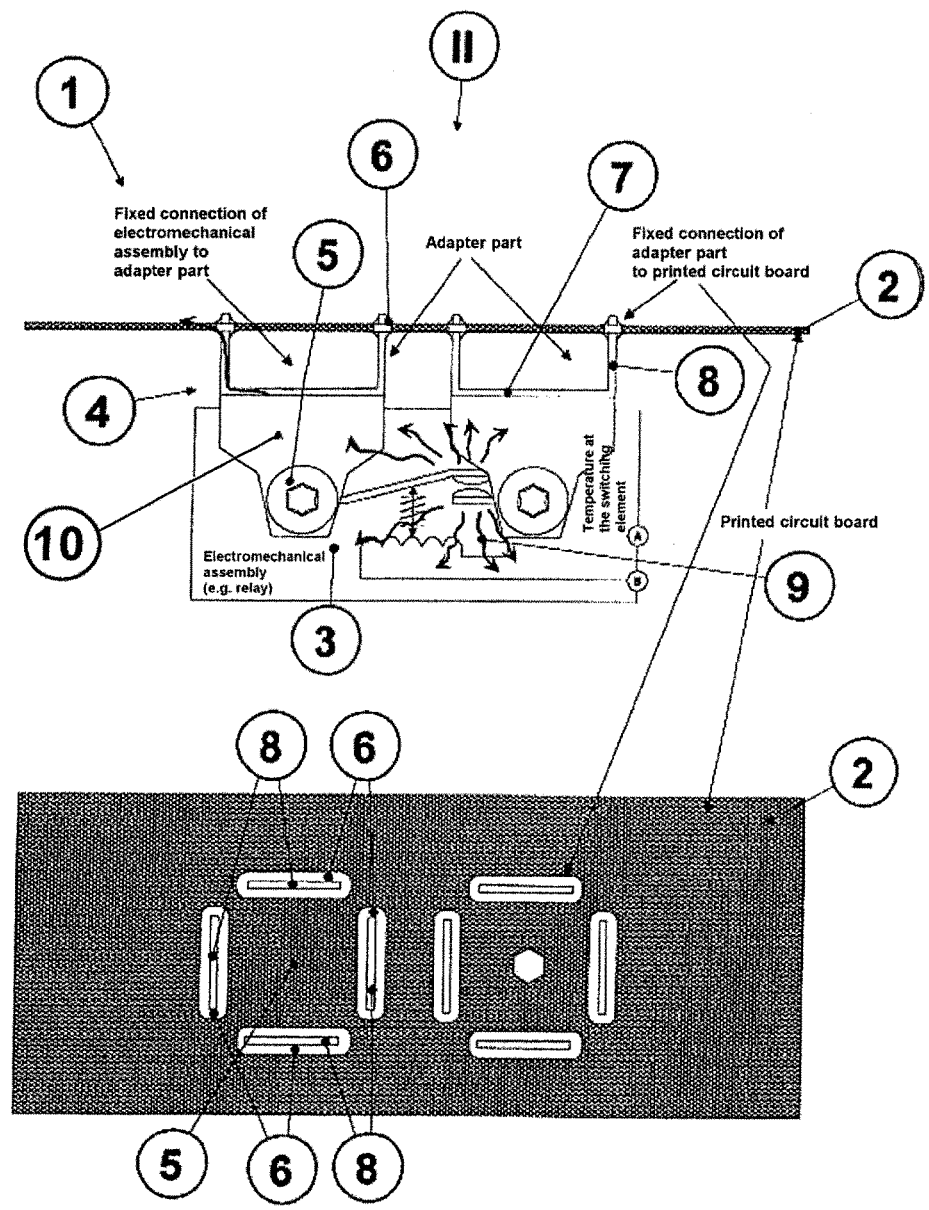
FIG. 3 shows a side view and a plan view of an electrical assembly in accordance with a further embodiment.
Figure 4:
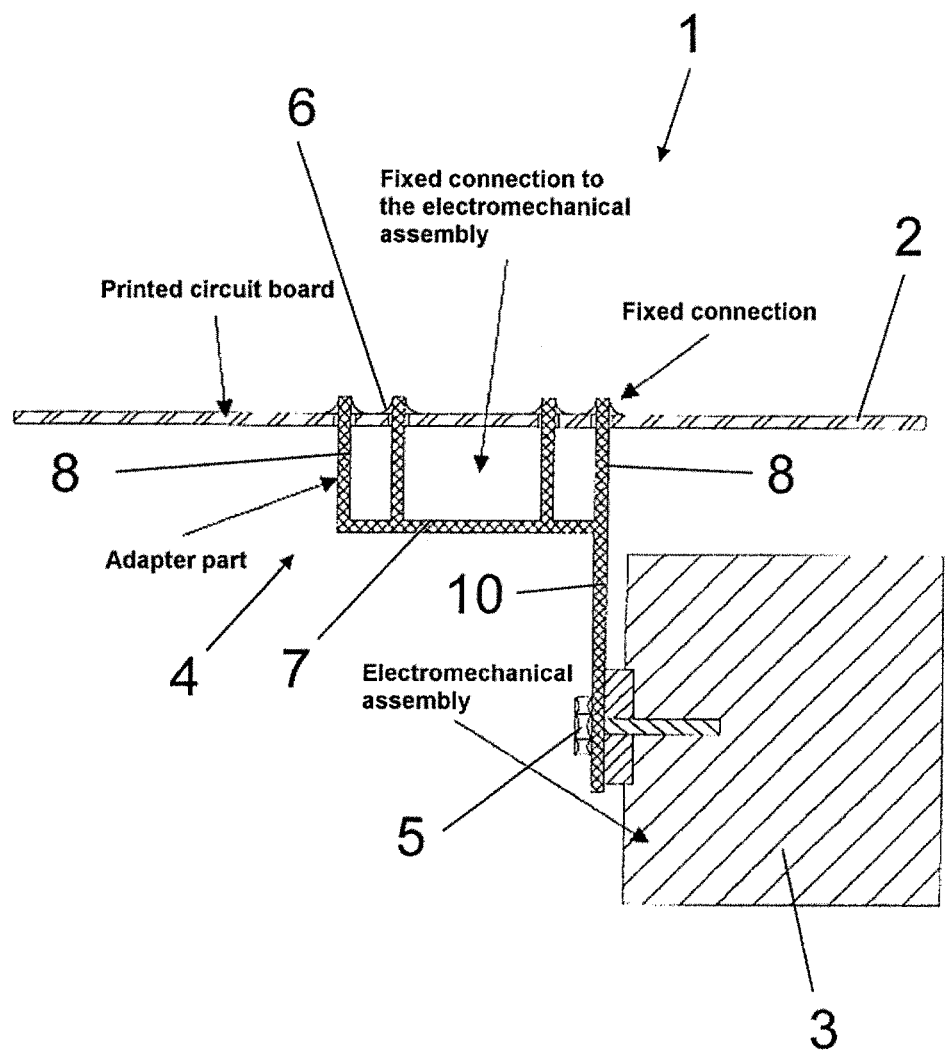
FIG. 4 shows a section through the assembly from FIG. 3.

Whereas the component 3 is arranged substantially parallel to the printed circuit board 2 in accordance with FIG. 1 and FIG. 2, in another embodiment that is shown in FIG. 3 and FIG. 4, the component 3 is arranged substantially perpendicularly to the printed circuit board 2, that is to say is mounted "lying down". For example, this can be expedient on account of the installation space available for the electrical assembly 1. The adapter part again configured as a fork-shaped element 4 has a base area 7, from which four fork prongs 8 protrude. Furthermore, a connection part 10 protrudes from the base area 7. Specifically, the connection part 10 is arranged opposite the fork prongs 8 with respect to the base area 7, that is to say that the connection part 10 protrudes from the base area 7 opposite the fork prongs 8. The connection part 10 is secured to the component 3 by means of a screw 5.

The printed circuit board 2 can be a high-current printed circuit board. To this end, solid copper elements can be embedded in the printed circuit board 2 for the purpose of conducting a high current. A certain level of heat is created in the switching contact 3 on account of the high current flowing. The heat flow 9 can be at least partly dissipated by means of the fork-shaped element 4 to the printed circuit board 2 and from there, for example, by means of heat sinks (not shown in more detail).

The fork-shaped element 4 can be used as an adapter part in an assembly 1 for the battery system of a motor vehicle. However, the present invention is not restricted to the described and illustrated exemplary embodiment. Instead, it also comprises all developments known to those skilled in the art within the scope of the present invention defined by the patent claims. The fork-shaped element 4 according to the present invention can thus also be used in household devices, audio devices, video devices, telecommunications devices or the like, in order to connect two subassemblies in an assembly electrically and/or mechanically to one another.

LIST OF REFERENCE NUMERALS

1: (Electrical) assembly
2: First subassembly/printed circuit board
3: Second subassembly/component/switching contact
4: Adapter part/fork-shaped element
5: Screw
6: Contact point
7: Base area
8: Fork prongs
9: Heat flow
10: Connection part

The invention claimed is:

1. An assembly comprising a first subassembly, a second subassembly and an adapter part, wherein the first subassembly is electrically and/or mechanically connected to the second subassembly, wherein the adapter part is arranged between the first subassembly and the second subassembly for the purpose of electrically and/or mechanically connecting the first subassembly to the second subassembly, and wherein the adapter part is a fork-shaped element having a base area from which four fork-shaped prongs extend, with each of the four fork-shaped prongs being secured to the first subassembly, and the base area being secured to the second subassembly such that forces acting between the two subassemblies are absorbed by the adapter part.

2. The assembly as claimed in claim 1, wherein the first subassembly is a printed circuit board, wherein the second subassembly is a component, and wherein the component is electrically and/or mechanically connected to the printed circuit board.

3. The assembly as claimed in claim 1, wherein the base area is one of screwed, riveted, welded, or soldered to the second subassembly.

4. The assembly as claimed in claim 1, wherein each of the four fork-shaped prongs is soldered to the first subassembly, which is a printed circuit board, and wherein electrical contact points are provided on the printed circuit board for the soldering.

5. The assembly as claimed in claim 4, wherein the printed circuit board is a high-current printed circuit board having solid copper elements embedded in the printed circuit board for the purpose of conducting a high current.

6. The assembly as claimed in claim 1, wherein the four fork-shaped prongs extend from the base area in an approximately perpendicular manner, wherein the base area has an approximately rectangular shape in a plan view, wherein the four fork-shaped prongs are arranged at the sides of the rectangular base area, and wherein the four fork-shaped prongs are secured to electrical contact points.

7. The assembly as claimed in claim 1, wherein the base area is secured to the second subassembly, which is a component.

8. The assembly as claimed in claim 1, wherein a connection part protrudes from the base area, in a direction opposite to the four fork-shaped prongs with respect to the base area, and wherein the connection part is secured to the second subassembly.

9. The assembly as claimed in claim 1, wherein the fork-shaped element is produced from sheet metal as a stamped and bent part.

10. The assembly as claimed in claim 2, wherein the component is an electromechanical component selected from one of an electrical switching contact, an electrical switch and a relay, and wherein the assembly is an electrical assembly.

11. The assembly as claimed in claim 8, wherein the second subassembly is a component.

\* \* \* \* \*